United States Patent
Nicotra et al.

(10) Patent No.: US 6,235,610 B1
(45) Date of Patent: May 22, 2001

(54) PROCESS FOR SELECTIVELY IMPLANTING DOPANTS INTO THE BOTTOM OF A DEEP TRENCH

(75) Inventors: Maria Concetta Nicotra, Catania; Antonello Santangelo, Belpasso; Daniela Anna Masciarelli, Acireale, all of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/221,246

(22) Filed: Dec. 28, 1998

(30) Foreign Application Priority Data

Jan. 13, 1998 (EP) .................................. 98830006

(51) Int. Cl.[7] .................................. H01L 21/76
(52) U.S. Cl. ..................... 438/433; 438/424; 438/713
(58) Field of Search ................... 438/433, 231, 438/450, 424, 427, 713, 213

(56) References Cited

U.S. PATENT DOCUMENTS

| | | | |
|---|---|---|---|
| 4,169,000 | * | 9/1979 | Riseman ............... 438/433 |
| 4,507,849 | * | 4/1985 | Shinozaki ............. 438/433 |
| 4,820,654 | | 4/1989 | Lee ..................... 437/67 |
| 5,236,863 | | 8/1993 | Iranmanesh ........... 437/90 |
| 5,445,989 | | 8/1995 | Lur et al. ............. 437/67 |
| 5,616,513 | * | 4/1997 | Shepard ................ 434/433 |
| 5,706,164 | | 1/1998 | Jeng .................. 361/321.4 |
| 5,770,504 | * | 6/1998 | Brown et al. ......... 438/433 |
| 5,849,625 | * | 12/1998 | Hsue et al. .......... 438/433 |
| 5,945,352 | * | 8/1999 | Chen et al. .......... 438/713 |
| 6,030,881 | * | 2/2000 | Papasouliotis ........ 438/424 |
| 6,033,961 | * | 3/2000 | Xu et al. ............. 438/424 |
| 6,069,057 | * | 5/2000 | Wu .................... 438/424 |

OTHER PUBLICATIONS

Patent Abstracts of Japan, vol. 018, No. 277 (E–1554), May 26, 1994 & JP 06 053315 A (Nec Corp.), Feb. 25, 1994 Only Abstract in English.

Patent Abstracts of Japan, vol. 018, No. 066 (E–1501_, Feb. 3, 1994 & JP 05 283520 A (Nec Corp.) Oct. 29, 1993 Only Abstract in English.

Biberger et al., "Collimated TI/TIN Contact and Barrier Layers for Sub 0.5MUM CVD W–Filled Contact Holes", Thin Solid Films, vol. 270, No. 1/02, Dec. 1, 1995, pp. 522–525.

Gross et al., "Silicon Dioxide Trench Filling Process in a Radio–Frequency Hollow Cathode Reactor", Journal of Vacuum Science & Technology: Part B, vol. 11, No. 2, Mar. 1, 1993, pp. 242–248.

\* cited by examiner

*Primary Examiner*—Charles Bowers
*Assistant Examiner*—David S Blum
(74) *Attorney, Agent, or Firm*—Theodore E. Galanthay; Allen, Dyer, Doppelt, Milbrath & Gilchrist, P.A.

(57) ABSTRACT

A process for selectively introducing a dopant into the bottom of a trench formed in a semiconductor material layer includes depositing a barrier layer by a process of deposition over the semiconductor material layer to form a deposited barrier layer. The deposited barrier layer has, over lateral walls and a bottom wall of the trench, a thickness which is lower than a nominal thickness of the deposited barrier layer over a planar surface of the semiconductor material layer. The method also including implanting a dopant using the deposited barrier layer as an implant mask.

30 Claims, 3 Drawing Sheets

PROCESS FOR SELECTIVELY IMPLANTING DOPANTS INTO THE BOTTOM OF A DEEP TRENCH

FIELD OF THE INVENTION

The present invention relates to semiconductor processing, and, more particularly, to a process for selectively implanting dopants in a trench.

BACKGROUND OF THE INVENTION

In the art of microelectronics deep trenches are frequently used. By way of example, in the field of vertical power MOS devices, deep trenches are used for electrically isolating adjacent semiconductor regions of the device. A trench is typically formed using a photolithographic mask and a highly anisotropic dry etching process of the semiconductor substrate. This process is suitable for forming trenches up to 10 μm deep and with a width of 1 μm or less, with rather vertical walls.

If trenches are used for the purpose of isolating different semiconductor regions in the horizontal direction with respect to the surface of the semiconductor, the conventional process allows for forming structures with limited overhead in terms of semiconductor area compared to other isolation techniques. An alternative isolation technique known as junction isolation provides for forming PN junctions. These junction regions which, to reach the required depth, are subject to a significant lateral diffusion. This is so even if the problem of area occupation in junction isolation can be partially reduced by using high implantation energies, exploiting channeling effects, and activating the implanted species by means of rapid thermal processes. It is still necessary to invert the conductivity type of the starting semiconductor region after the implanted dopant has been activated.

By the use of trenches all these problems can be avoided, and a reduction of the semiconductor area occupied can be achieved. It is however known that, e.g. when the trenches are used for electrical isolation, a dopant must be implanted into the bottom of the trench. The dopant is of the same conductivity type as that of semiconductor region of interest.

By way of example, in FIG. 1 there is depicted a cross-section of a NPN vertical transistor that is to be isolated from the remaining devices integrated in the same chip. The chip comprises a P type substrate 1, over which an N+ buried layer 2 has been formed and, over layer 2, an N type epitaxial layer 3. A P type base region 4 is formed in the N type epitaxial layer 3, and a base terminal B contacts the P base region 4. An N type emitter region 5 is formed inside the P type base region 4, and an emitter terminal E contacts the emitter region 5. An N+ sink region 6 is formed in the N type epitaxial layer 3 and extends down to the buried layer 2. A collector terminal C is connected to the N+ sink region 6. A deep trench 7 is formed in the N type epitaxial layer 3, the N+ buried layer 2, and part of the substrate 1.

The deep trench 7 isolates the NPN vertical transistor from other devices which are to be integrated as shown at the left thereof in the drawing. Such other devices may include, for example, another NPN vertical transistor of which there is shown only the N+ sink region 6' and the respective collector terminal C'. The trench 7 is conventionally filled with dielectric material, typically an oxide 8.

An inverted region can built-up in the semiconductor at the interface between the semiconductor and the dielectric material filling the trench. This is especially so if as shown in the drawing, the bottom end of the trench is within lightly doped P type semiconductor regions (that is the most common situation). The inverted region is equivalent to the conductive channel of a parasitic MOS transistor, and short-circuits the collector (buried layer 2) of the NPN transistor to the portions of the N+ buried layer 2 outside the NPN transistor region beyond the trench. Furthermore, an NPN lateral transistor is associated with the structure, and formed by the portion of the buried layer 2 in the NPN vertical transistor region, the substrate 1, and the portion of the buried layer 2 outside the NPN vertical transistor region beyond the trench.

To overcome the above-referred drawbacks, there is conventionally performed an ion implantation inside the trench to form a P+ well 9 in the semiconductor substrate 1 at the bottom of the trench 7 (FIG. 2). The P+ well 9 prevents the previously described parasitic MOS transistor from turning on, since the dopant concentration at the semiconductor/dielectric interface is increased, and additionally lowers the gain of the parasitic lateral NPN transistor.

However, performing a selective implant inside the trench to form the P+ well region 9 at the bottom thereof is inherently difficult. In particular, it is necessary to confine all the implanted dopant ions at the bottom of the trench. Clearly, over the planar top surface of the chip a mask layer is to be provided, and the implant must be performed orthogonally to the top surface of the chip. However, even in this way a fraction of the implanted dopant ions hits the lateral walls of the trench, since the walls are not perfectly vertical and the implanted ion beam cannot be perfectly collimated. In fact, it is quite difficult to form trenches with vertical walls uniformly in the entire chip area, and the degree of collimation of the implanted ion beams can vary inside the area to be implanted. The ions reaching the substrate have a predetermined angular distribution in terms of flux per unit of solid angle, which is quite high in the primary direction of the beam and that decreases more or less rapidly for directions which become more and more different from the main one.

For the above reasons, a fraction of the implanted dopant ions is actually implanted into the lateral walls of the trench. Such a fraction is higher the higher the inclination of the lateral walls of the trench and the worse the collimation of the implantation beam. By way of example, if the lateral walls of the trench are inclined at 10° and assuming that the implantation beam is perfectly collimated, then a dose of dopant approximately equal to 17% of the total implanted dose is implanted into the lateral walls of the trench.

In practice, the inclination of the lateral walls of the trench is not constant, and increases downward toward the bottom of the trench, where the lateral walls are nearly vertical. Since the implant is performed orthogonally to the top surface of the chip and this direction normally coincides with a crystallographic axis of the semiconductor substrate, to avoid problems of "channeling" it is necessary to grow a layer of oxide over the surface. This, however, does not overcome the problem of implantation of dopants into the lateral walls.

SUMMARY OF THE INVENTION

In view of the state of the art described, it is an object of the present invention to provide a process for selectively implanting dopants only into the bottom of a trench, and substantially without affecting the lateral walls of the trench.

According to the present invention, such an object is attained by a process for selectively introducing a dopant into the bottom of a trench formed in a semiconductor material layer, characterized by providing for depositing a barrier layer by a process of deposition over the semiconductor material layer. This is done to form a deposited barrier layer having, over lateral walls and a bottom wall of the trench, a thickness which is less than a nominal thickness of the deposited barrier layer over a planar surface of the semiconductor material layer. The method further includes implanting a dopant using the deposited barrier layer as an implant mask.

In one embodiment, the process of deposition provides for a chemical vapor deposition (CVD) of a barrier layer. In another embodiment, the process of deposition provides for a physical vapor deposition (PVD) of a barrier layer. The deposited barrier layer can be a nitride layer, an oxide layer or a metal layer.

BRIEF DESCRIPTION OF THE DRAWINGS

Other objects, features and advantages of the present invention will become apparent by the following detailed description of some embodiments thereof, illustrated as non-limiting examples in the drawings, wherein.

DETAILED DESCRIPTION OF THE PREFERRED EMBODIMENTS

To be able to selectively implant dopants only at the bottom of a trench and not into the lateral walls thereof, an implantation mask is necessary having a thickness sufficient to prevent the implanted dopants from reaching the top surface of the substrate wherein the trench is formed, as well as the lateral walls of the trench. According to the present invention, a feature of almost all the deposition techniques (CVD, PVD) is exploited, that is the poor coverage capability of the walls of a generic opening in a substantially planar layer (such as for example a contact window in a dielectric layer) by the deposited barrier layer. For the case where the barrier layer is an oxide layer deposited by Chemical Vapor Deposition (CVD) techniques, such as Plasma Enhanced CVD (PECVD) or Atmospheric Pressure CVD (APCVD), $SiH_4$ and $N_2O$ (PECVD) or $SiH_4$ and $O_2$ (APCVD) are normally employed as reaction gases.

The deposited oxide layer thus obtained is far from being conformal to the profile of the surface over which it is deposited. Inside micrometer or submicrometer openings in the thickness of the deposited layer are lower than that of the same layer over a planar surface outside the opening. This effect depends on the shape, the size and the depth of the opening. For example, in an APCVD process performed by a conventional WATKINS JOHNSON apparatus on an integrated circuit comprising contact windows 1 $\mu$m deep and 2 $\mu$m wide, the thickness of the deposited oxide layer over the lateral walls and the bottom of the contact window is approximately half the nominal thickness. Additionally, if the lateral walls of the opening are vertical, the surface of the deposited oxide layer is inclined in such a way that the walls are shaded with respect to a direction orthogonal to the top surface of the substrate. Suitable alternative barrier layers are a nitride layer or a metal layer.

These features are normally considered as drawbacks for the deposition processes, but are advantageously used in a process according to the present invention to obtain an automatic selective protection of the substrate top surface and of the lateral walls of the opening. This allows the dopants to be implanted substantially only into the bottom of the opening.

Figure 3:
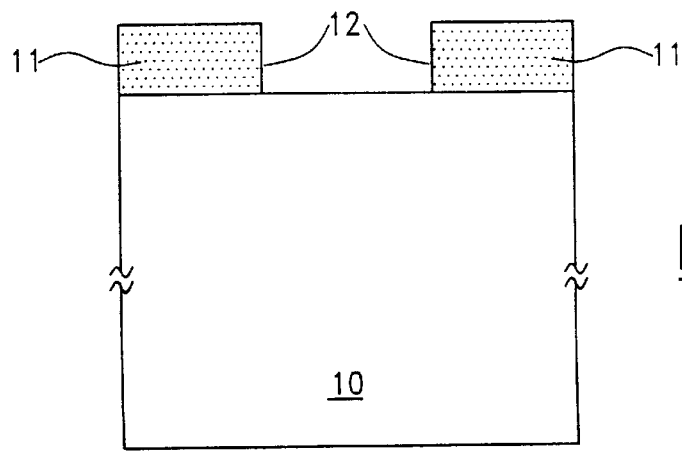
FIGS. 3 to 5 show steps of a process according to a first embodiment of the present invention.
Figure 4:
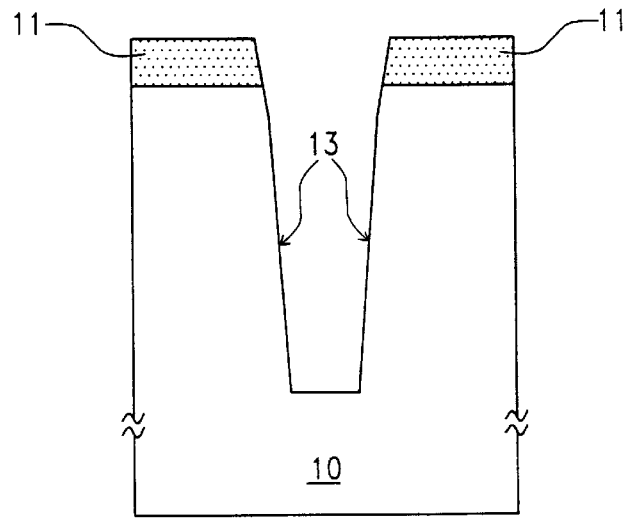
Figure 5:
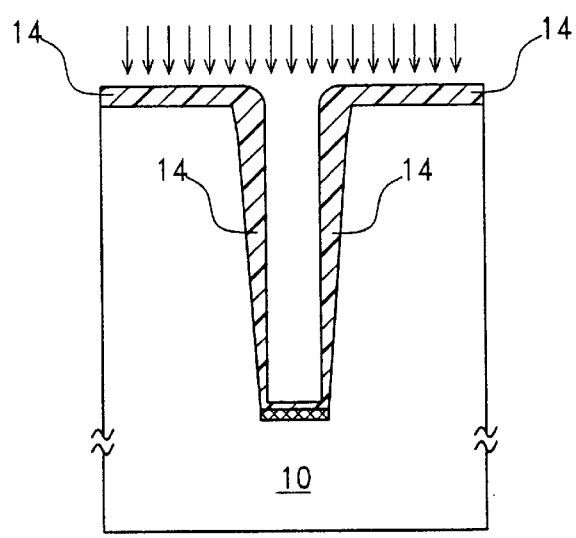

Referring now to FIGS. 3 to 5, a first embodiment of the process according to the present invention is described. The process provides for the deposition, over a semiconductor substrate 10, of a photoresist layer 11 which, by conventional photolithography, which is then selectively removed to form an opening 12 therein (FIG. 3). The remaining photoresist layer 11 protects the substrate 10.

Then, an etching process is performed to form a trench 13 in the substrate corresponding to the opening 12 (FIG. 4). The etching process is anisotropic and is conventionally performed in an ambient with plasma. Accordingly, a trench 13 is formed having substantially vertical walls, with an inclination angle of less than 10° with respect to the direction orthogonal to the top surface of the substrate.

The photoresist layer 11 is subsequently removed, and a layer of oxide 14, not conformal with the profile of the trench 13, is deposited. The thickness of the oxide layer 14 is to be chosen depending on the dopant species to be subsequently implanted, and on the implantation energy. By way of example, if the dopant species is boron and the latter is implanted at an energy of 50 Kev, the thickness of the oxide layer 14 can be 4000 Å.

For the deposition of the oxide layer 14, a WATKINS JOHNSON 999R apparatus can, for example, be employed, at a temperature of approximately 420 ° C. using a flux of $SiH_4$ of 0.45 SLPM and a flux Of $O_2$ of 0.547 SLPM, properly diluted in $N_2$. Such a deposition process produces, inside a trench of approximately 1 $\mu$m width at the top and approximately 5 $\mu$m deep, with lateral walls that in the upper portion have an inclination of approximately 10°, a layer of oxide 14. This layer of oxide 14, over the surface of the upper portion of the lateral walls, has a thickness of approximately 1500 Å. This thickness slowly decreases towards the bottom to approximately 300 Å at the bottom of the trench.

Simple considerations regarding the projected range $R_p$ and the standard deviation of the projected range $\Delta R_p$ show that the fraction of dopant dose that is implanted into the top, flat surface of the substrate 10, where the oxide layer 14 has a thickness of 4000 Å, is negligible. As regards the trench, taking into account that the profile of the oxide layer 14 is more vertical than the lateral walls of the trench due to a reduction of the oxide layer thickness towards the bottom of the trench, the angle between the direction of the implanted ions and the surface of the oxide layer 14 is approximately 5°, instead of the 10° inclination of the lateral walls of the trench. Accordingly, the fraction of the dopant dose that is implanted into the oxide layer covering the lateral walls of the trench is reduced due to the presence of the oxide layer 14, from approximately 17% (if the oxide layer were not present) to approximately 9% (with the oxide layer).

Simple numeric simulations show that, for example in the upper region of the trench where the oxide layer 14 has a thickness of 1500 Å, the fraction of dopant dose that penetrates into the lateral walls of the trench is approximately 0.7%. Thus, the total fraction of the boron ions that is implanted into the lateral walls of the trench is reduced to 0.06%, compared to approximately 17% in the case where the oxide layer 14 were absent. A further reduction of the implantation energy improves the result, while if the oxide layer 14 were absent a reduction of the implantation energy would not lead to any improvement.

As regards the bottom of the trench, the dose of dopants that is lost in the 300 Å of the oxide layer 14 covering the bottom of the trench is less than 1% of the total dose. Accordingly, the fraction of dopant dose actually implanted into the substrate 10 at the bottom of the trench is substantially the nominal implantation dose. After the dopants have been implanted, the oxide layer 14 can be removed, e.g. by a wet etching process.

Figure 6:
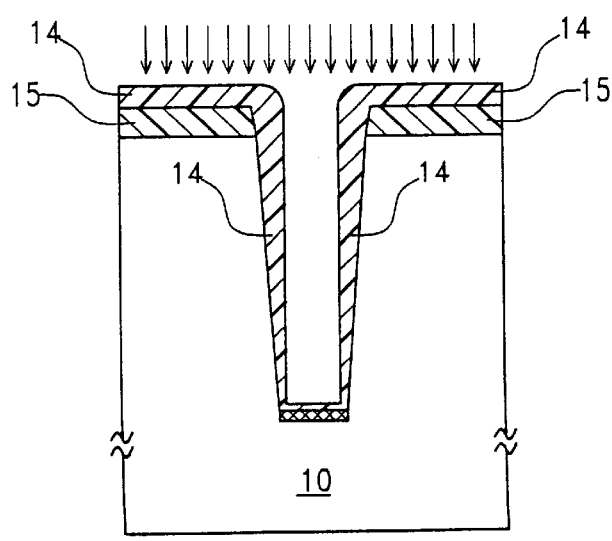
FIG. 6 relates to a second embodiment of the invention.

FIG. 6 relates to a process according to a second embodiment of the invention. In this embodiment, differently from the previous one, the mask for the anisotropic etching of the substrate 10 to form the trench is not provided by photoresist, but by a dielectric layer 15, such as, for example, a deposited oxide layer (e.g., such as a layer of vapox material as will be known by those skilled in the art). Alternately, the dielectric layer 15 may be an oxide layer thermally grown over the whole exposed surface of the substrate 10 for the case where the substrate is made of silicon. Conventional photolithography and etching allow forming a window in the dielectric layer 15 similar to the window 12 in FIG. 3.

The substrate 10 is then submitted to an anisotropic etching process as described in connection with the previous embodiment for the formation of the trench. The deposition of the non-conformal oxide layer 14 can then be performed directly over the remaining portion of the dielectric layer 15, as depicted in FIG. 6. Alternatively, the dielectric layer 15 can be completely removed before depositing the non-conformal oxide layer 14. This process is advantageous because, referring back to FIG. 4, it is often difficult to achieve a high selectivity in the etching of the photoresist layer 11 and the semiconductor substrate 10 for the definition of the trench. In this embodiment this problem is overcome because the mask for the definition of the trench is not formed by photoresist material.

In the particular case of a dielectric layer 15 made of thermally-grown oxide it is also possible to remove the deposited non-conformal oxide layer 14 by a wet chemical etching. This exploits the fact that the etch rate of the deposited oxide 14 is higher than the etch rate of the thermally-grown oxide 15.

Figure 7:
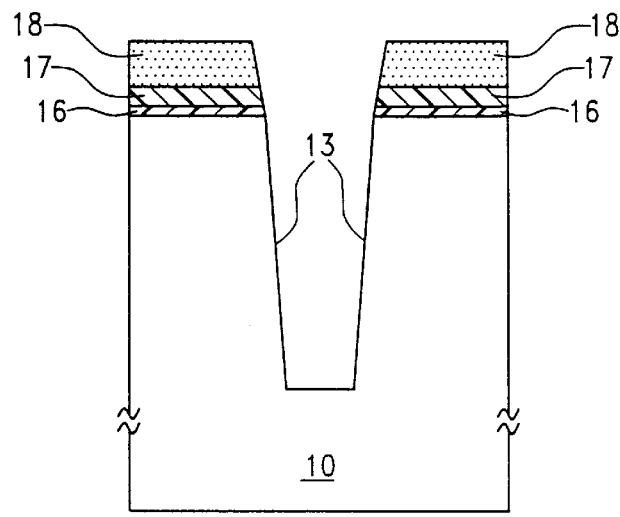
FIGS. 7 to 9 show steps of a process according to a third embodiment of the present invention.
Figure 8:
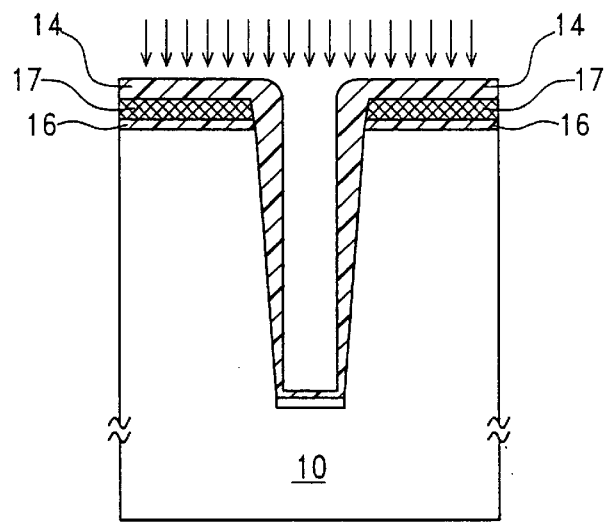
Figure 9:
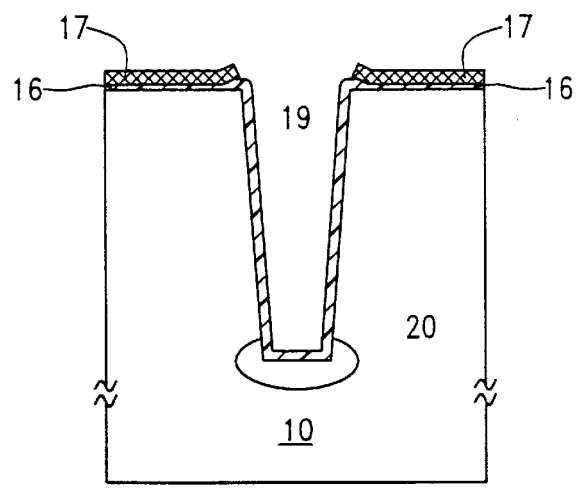

FIGS. 7 to 9 show a process according to a third embodiment of the present invention. This embodiment is particularly suitable for the case where the semiconductor substrate 10 is made of silicon and it desired to selectively oxidize the walls of the trench after the dopants have been implanted into the bottom of the trench. In this embodiment, before the formation of the trench, a layer of silicon dioxide 16 approximately 250 Å thick is thermally grown over the whole surface of the substrate 10. Then, a film 17 of $Si_3N_4$ of approximately 700 Å is deposited. By means of conventional photolithography a mask layer 18 is formed and patterned. The mask layer 18 is made either of photoresist as in the first embodiment or of vapox as in the second embodiment. The substrate 10 is then etched to form the trench 13.

Then, the non-conformal oxide layer 14 is deposited, and dopant ions are implanted using layer 14 as a mask for the lateral walls of the trench. The non-conformal oxide layer 14 is then selectively removed by means of a chemical etching, such as, for example, a solution of $HF:H_2O$. A silicon dioxide layer 19 is then thermally grown over the walls of the trench. During the thermal oxidation process, the implanted dopants are activated and made to diffuse, to form a doped region 20.

As a result of the process of the present invention, it is possible to perform a selective implantation of dopants into the bottom of a trench formed into a semiconductor substrate. The implanted dopants are selectively confined in the bottom region, thereby preventing the contamination of the lateral walls of the trench and of the surface of the substrate. In the particular case of a semiconductor substrate made of a single-crystal material with a preferred crystal orientation orthogonal to the surface, the thin oxide layer that is formed over the bottom of the trench reduces or even eliminates the problems of channeling.

Figure 1:
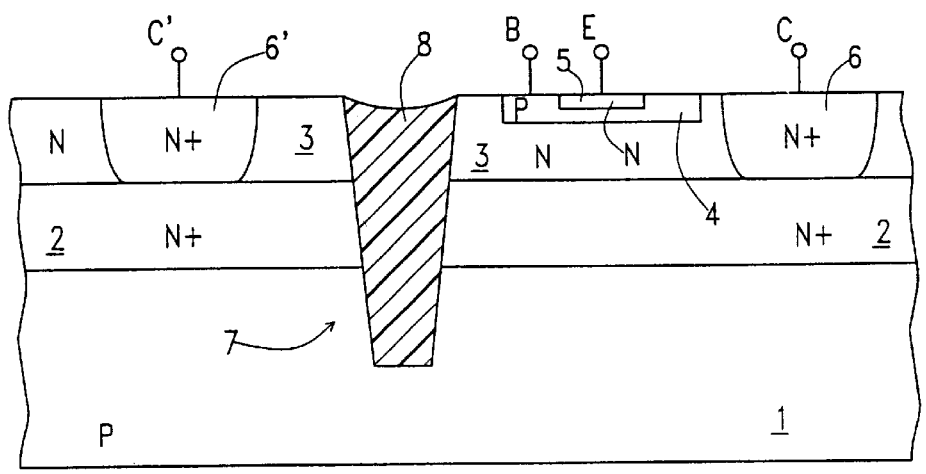
FIG. 1 is a cross-sectional view of an integrated circuit including a vertical NPN transistor, in which a trench is used for electrical isolation according to the prior art.
Figure 2:
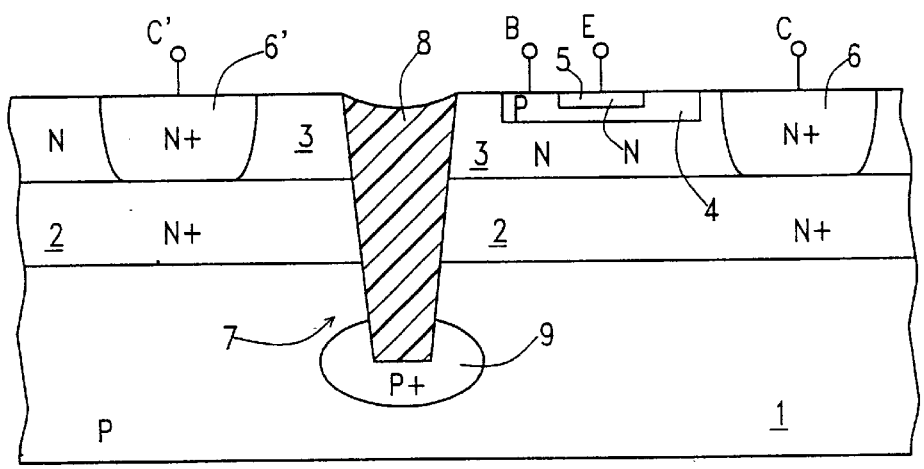
FIG. 2 is similar to FIG. 1, with the addition of a doped region formed at the bottom of the trench.

If, for example, the trench is used for isolation purposes as in FIGS. 1 and 2, the process of the present invention allows the protection of the epitaxial layer 3 from contamination by the dopants implanted to form the P+ region 9, and thus prevents the formation in the epitaxial layer 3 of a P type well. The elimination of channeling effects allows in this case for a better confinement at the exposed surface of the substrate 1 at the bottom of the trench of the implanted dopants. This allows a higher surface concentration of the P+ region 9. The presence of the non-conformal oxide layer 14 during the implantation process and the removal of the same after the implantation has been performed prevent the contamination of the substrate by metal impurities due to the implant process. In other words, the thin oxide layer 14 covering the bottom of the trench acts as preimplant oxide.

That which is claimed is:

1. A process for selectively introducing a dopant into a bottom of a trench in a semiconductor material layer, the trench having sloped side walls and a bottom wall, the process comprising the steps of:

depositing a nonconformal barrier layer adjacent the semiconductor material layer to form a deposited barrier layer having a first thickness over a planar surface of the semiconductor material layer, a second thickness less than the first thickness over the bottom wall of the trench, and a thickness over the sloped side walls of the trench decreasing from the first thickness to the second thickness; and implanting a dopant through the deposited barrier layer and into the semiconductor material layer using the nonconformal deposited barrier layer as an implant mask, the dopant implanted in the semiconductor material layer corresponds to at least a width of the bottom wall of the trench.

2. A process according to claim 1, wherein the step of depositing comprises depositing the barrier layer using chemical vapor deposition.

3. A process according to claim 1, wherein the step of depositing comprises depositing the barrier layer using physical vapor deposition.

4. A process according to claim 1, wherein the step of implanting comprises implanting a dopant orthogonally to the planar surface of the semiconductor material layer.

5. A process according to claim 1, wherein the step of forming the trench comprises the steps of:

forming a mask layer over the semiconductor material layer; and selectively etching the semiconductor material layer using the mask layer.

6. A process according to claim 5, wherein the mask layer comprises a photoresist layer.

7. A process according to claim 5, wherein the step of forming the mask layer comprises the steps of:
  forming a dielectric layer over the semiconductor material layer;
  depositing a photoresist layer over the dielectric layer; and
  selectively removing the photoresist layer and etching the dielectric layer and the semiconductor material layer.

8. A process according to claim 7, wherein the step of forming the dielectric layer comprises depositing an oxide layer.

9. A process according to claim 7, wherein the step of forming the dielectric layer comprises thermally growing an oxide layer.

10. A process according to claim 7, wherein the barrier layer is deposited over the dielectric layer.

11. A process according to claim 7, further comprising the step of removing the dielectric layer before depositing the barrier layer.

12. A process according to claim 1, wherein the semiconductor material layer comprises silicon; and wherein the step of forming the trench comprises the steps of:
  thermally growing a silicon dioxide layer over the silicon layer;
  depositing over the silicon dioxide layer a layer of $Si_3N_4$;
  forming a mask layer over the $Si_3N_4$ layer; and
  etching the $Si_3N_4$ layer, the silicon dioxide layer and the silicon layer to form the trench.

13. A process according to claim 12, wherein after the step of implanting, the deposited barrier layer is removed and a silicon dioxide layer is thermally grown over the side walls and bottom walls of the trench.

14. A process according to claim 1, wherein the deposited barrier layer comprises a nitride.

15. A process according to claim 1, wherein the deposited barrier layer comprises an oxide.

16. A process according to claim 1, wherein the deposited barrier layer comprises metal.

17. A semiconductor process comprising the steps of:
  forming a trench in a semiconductor material layer, the trench having sloped side walls and a bottom wall;
  forming a nonconformal barrier layer adjacent the semiconductor material layer to have a first thickness over a planar surface of the semiconductor material layer, a second thickness less than the first thickness over the bottom wall of the trench, and a thickness over the sloped side walls of the trench decreasing from the first thickness to the second thickness; and
  implanting a dopant through the nonconformal barrier layer and into the semiconductor material layer using the nonconformal barrier layer as an implant mask to thereby selectively introduce the dopant into the bottom of the trench, the dopant implanted in the semiconductor material layer corresponds to at least a width of the bottom wall of the trench.

18. A semiconductor process according to claim 17, further comprising the step of diffusing the implanted dopant into adjacent portions of the semiconductor material layer.

19. A semiconductor process according to claim 17, wherein the step of forming the barrier layer comprises depositing the barrier layer by at least one of chemical vapor deposition and physical vapor deposition.

20. A semiconductor process according to claim 17, wherein the step of implanting comprises implanting a dopant orthogonally to the planar surface of the semiconductor material layer.

21. A semiconductor process according to claim 17, wherein the step of forming the trench comprises the steps of:
  forming a mask layer over the semiconductor material layer; and
  selectively etching the semiconductor material layer using the mask layer.

22. A semiconductor process according to claim 21, wherein the mask layer comprises a photoresist layer.

23. A semiconductor process according to claim 21, wherein the step of forming the mask layer comprises the steps of:
  forming a dielectric layer over the semiconductor material layer;
  depositing a photoresist layer over the dielectric layer; and
  selectively removing the photoresist layer and etching the dielectric layer and the semiconductor material layer.

24. A semiconductor process according to claim 23, wherein the step of forming the dielectric layer comprises depositing an oxide layer.

25. A semiconductor process according to claim 23, wherein the step of forming the dielectric layer comprises thermally growing an oxide layer.

26. A semiconductor process according to claim 23, wherein the barrier layer is formed over the dielectric layer.

27. A semiconductor process according to claim 23, further comprising the step of removing the dielectric layer before forming the barrier layer.

28. A semiconductor process according to claim 17, wherein the semiconductor material layer comprises silicon; and wherein the step of forming the trench comprises the steps of:
  thermally growing a silicon dioxide layer over the silicon layer;
  depositing over the silicon dioxide layer a layer of $Si_3N_4$;
  forming a mask layer over the $Si_3N_4$ layer; and
  etching the $Si_3N_4$ layer, the silicon dioxide layer and the silicon layer to form the trench.

29. A semiconductor process according to claim 28, wherein after the step of implanting, the barrier layer is removed and a silicon dioxide layer is thermally grown over the side walls and bottom walls of the trench.

30. A process according to claim 17, wherein the barrier layer comprises at least one of a nitride, an oxide, and a metal.

* * * * *